United States Patent
Son et al.

(10) Patent No.: US 6,421,456 B1
(45) Date of Patent: *Jul. 16, 2002

(54) SEMICONDUCTOR WAFER ON WHICH RECOGNITION MARKS ARE FORMED AND METHOD FOR SAWING THE WAFER USING THE RECOGNITION MARKS

(75) Inventors: Dae Woo Son; Youn Soo Lee; Byung Man Kim, all of Cheonan (KR)

(73) Assignee: Samsung Electronics Co., Ltd., Kyungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,003

(22) Filed: Dec. 2, 1998

(30) Foreign Application Priority Data

Dec. 23, 1997 (KR) .............................. 97-72651

(51) Int. Cl.$^7$ ................................. G06K 9/00
(52) U.S. Cl. ...................... 382/145; 382/147
(58) Field of Search .................. 382/147, 151, 382/181, 173, 199, 203, 266; 356/401; 250/491.1; 364/488, 489; 428/428; 438/33, 14, 16; 348/126, 125

(56) References Cited

U.S. PATENT DOCUMENTS

| | | | | |
|---|---|---|---|---|
| 4,328,553 A | * | 5/1982 | Fredriksen et al. | 358/101 |
| 4,780,615 A | * | 10/1988 | Suzuki | 250/548 |
| 4,791,302 A | * | 12/1988 | Nozue | 356/401 |
| 5,274,575 A | * | 12/1993 | Abe | 364/488 |
| 5,686,171 A | * | 11/1997 | Vokoun et al. | 428/209 |
| 5,851,848 A | * | 12/1998 | Balamurugan | 438/33 |
| 5,917,935 A | * | 6/1999 | Hawthorne et al. | 382/141 |
| 6,154,561 A | * | 11/2000 | Pratt et al. | 382/125 |

* cited by examiner

Primary Examiner—Leo Boudreau
Assistant Examiner—Sheela Chawan
(74) Attorney, Agent, or Firm—Skjerven Morrill LLP; David W. Heid

(57) ABSTRACT

On a semiconductor wafer, recognition marks are fabricated on the crossing points of scribe lines for the purpose of proper wafer alignment in wafer sawing process. Since the recognition mark has a distinctive pattern that is distinguished from other circuit patterns on the chip, the recognition mark can be easily recognized by a camera in a sawing apparatus, and reduce the chance of wafer misaligning. When a part of circuit pattern on the semiconductor chip is used for the alignment purpose, the chance of wafer misalignment relatively high due to the similarity between the part chosen and other parts of the circuit pattern. The present invention also provides a method for sawing the wafer using the recognition marks.

11 Claims, 9 Drawing Sheets

SEMICONDUCTOR WAFER ON WHICH RECOGNITION MARKS ARE FORMED AND METHOD FOR SAWING THE WAFER USING THE RECOGNITION MARKS

BACKGROUND OF THE INVENTION

1. Field of the Invention

The present invention generally relates to a semiconductor wafer and a method for sawing the wafer, and more particularly to a semiconductor wafer which has recognition marks on the points where vertical and horizontal scribe lines cross each other, and a method for sawing the wafer using the recognition marks.

2. Description of the Related Arts

The integrated circuit manufacturing process is divided into several steps such as circuit fabrication, assembly, and testing. The circuit fabrication forms integrated circuits on a semiconductor wafer. After fabrication, the first step of assembly is wafer sawing which divides the wafer into a plurality of individual integrated circuit chips.

Referring to FIG. 1, a wafer 10 comprises a plurality of semiconductor chips 12 having integrated circuits formed thereon. Semiconductor chips 12 are separated from each other by a plurality of vertical and horizontal scribe lines 14 and 16, respectively. Scribe lines 14 and 16 have no circuitry, and a sawing process cuts the wafer 10 along scribe lines 14 and 16. The width of vertical and the horizontal scribe lines 14 and 16 have typical widths of about from 5 to 7 mils.

Referring to FIG. 2 through FIG. 4, a method for using a wafer sawing apparatus 70 to saw wafer 10 will be described. The wafer 10 is loaded on a wafer aligning stage 72 of wafer sawing apparatus 70. Then, alignment and sawing of wafer 10 are carried out. FIG. 2 depicts wafer sawing where saw blade 74 is aligned along a horizontal scribe line 16.

In aligning wafer 10 for sawing, a recognition means such as a camera 76 recognizes any two spots on wafer 10, and a control part 28 uses the spots as references when aligning one of horizontal scribe lines 16 of wafer 10 under saw blade 74.

The next step is an inspection of whether horizontal scribe line 16 is properly aligned under saw blade 74. With reference to FIG. 2 and FIG. 3, camera 76 images an area A of an integrated circuit pattern on a semiconductor chip 12 on wafer 10, (hereinafter, the pattern in area A being referred to as a "standard pattern") and transfers the image of area A to a control unit 78. Control unit 78 uses the image of area A as a reference image in subsequent alignment inspection.

Other semiconductor chips 12 on the wafer 10 have the same patterns as the standard pattern. Camera 76 images nine areas A to I of the semiconductor chips 12 and transmits the image of each area to control unit 78. The distance between adjacent areas are known according to the size of semiconductor chips 12. The image of area A indicates the standard pattern and areas B to I should contain the same pattern if wafer 10 is properly aligned. The reference image of area A is given a recognition value of 100, and the recognition values of the nine spots A to I are calculated based on the images from camera 76 as displayed on a monitor 77 of the control unit 78. If all recognition values of the spots A to I are greater than a judgment value, control unit 78 decides that wafer 10 is properly aligned. However, if any of the recognition values of areas A to I is less than the judgment value, control unit 78 decides that wafer 10 is not properly aligned. A typical judgment value is 70.

The above-described wafer alignment method is referred to as a Pattern Matching System (PMS) method, and adopted in a model DFD-640 wafer sawing apparatus which was developed by DISCO. Another wafer alignment method is the Pattern Recognition System (PRS) method. This method is adopted in a model SD02-8W wafer sawing apparatus which was developed by SEICO SEIKI. The PMS method recognizes integrated circuit patterns of the wafer by classifying them into two colors, black and white, but the PRS method recognizes the patterns by classifying them into 256 colors.

An operator of sawing apparatus 10 chooses a spot (area A) on a semiconductor chip 12 for a reference pattern by his/her own judgment. With reference to FIG. 4, since camera 76 (FIG. 2) recognizes integrated circuit patterns by brightness of the patterns, a spot which has features that are easily distinguished from other patterns by the brightness recognition, is ideally designated as a reference spot.

With the above methods, the reference spot and other spots recognized for alignment inspection are parts of semiconductor chips 12. Since the recognized spots are not the area to be sawn, it is necessary to correct the position of the wafer 10 so that the scribe lines 14 and 16 are aligned under the saw blade 74, based on the relative position of the recognized spots to scribe lines 14 and 16. Dotted lines 18 on vertical and horizontal scribe lines 14 and 16 are where saw blade 74 (FIG. 2) contacts and saws wafer 10.

A reference numeral 20 in FIG. 4 indicates a window, that is, an area in which camera 76 (FIG. 2) recognizes the pattern. The position of the camera 76 is adjusted using a vertical line 26 and a horizontal line 28 of window 20. In FIG. 4, features 15 are hatched differently to indicate a difference in the brightness of features 15.

Table 1 shows the recognition values of the nine areas A to I on wafer 10, the judgment based on the recognition values, and the decision regarding an exemplary wafer sawing operation.

TABLE 1

| Spot | A | B | C | D | E | F | G | H | I |
|---|---|---|---|---|---|---|---|---|---|
| Recognition value | 91 | 79 | 94 | 97 | 98 | 93 | 65 | 50 | 90 |
| Judgment | OK | OK | OK | OK | OK | OK | bad | bad | OK |
| Operation | alignment failure/wafer sawing mistake | | | | | | | | |

Area A is the reference pattern as described above. The reason that the recognition values of areas A to I are not 100 is that the recognized image from each spot is not exactly the same as the reference image initially taken from spot A due to small mechanical operation error of camera 76. However, the recognition values less than 70 for areas G and H means that the patterns recognized in areas G and H are different from the pattern in area A, and thereby wafer 10 is misaligned. A problem occurs when wafer 10 is misaligned, but the recognition values are greater than 70 because each semiconductor chip 12 contains multiple copies of the reference pattern or a similar pattern. For example, when camera 76 recognizes the pattern in window 24 due to the wafer misalignment, the recognition value from the spot in window 24 can be greater than 70 because of a little difference between the patterns of spot A and the spot in window 24. This misalignment can make saw blade 74 cut wafer 10 across semiconductor chips 12, not along scribe lines 14 and 16. Furthermore, if wafer 10 includes different kinds of semiconductor chips 12, wafer alignment process becomes complicated because respective reference spots are designated for different chips 12.

SUMMARY OF THE INVENTION

Accordingly, an object of the present invention is to provide a semiconductor wafer on which standardized recognition marks are formed and a wafer sawing method using the recognition marks.

Another object of the present invention is to provide a semiconductor wafer having standard recognition marks which prevent the wafer sawing failure due to wafer misalignment and a wafer preparation method for semiconductor wafer sawing. The preparation method comprises formation of standard recognition marks on the wafer and sawing the wafer by using the standard recognition marks for alignment of the wafer.

In order to achieve the foregoing and other objects, the present invention provides a semiconductor wafer comprising a plurality of semiconductor chips, a plurality of scribe lines including horizontal scribe lines and vertical scribe lines, and standard recognition marks formed at the points where the horizontal and the vertical scribe lines cross each other. Particularly, the standard recognition marks of the present invention have patterns which can be easily and clearly recognized by the camera during the semiconductor wafer aligning for wafer sawing. For example, the patterns comprise a plurality of dark lines and at least one crossing point of the lines. It is preferable that the ratio of the bright regions to the dark regions in the standard recognition mark is about 1:1.

In another aspect, the present invention provides a method of semiconductor wafer preparation, comprising formation of standard recognition marks on the wafer, aligning the wafer using the marks, and sawing semiconductor wafers. In fabricating semiconductor wafers including many semiconductor integrated circuit chips, standard recognition marks with special patterns are formed on the crossing points of the horizontal and the vertical scribe line. When the semiconductor wafer is loaded on a wafer sawing apparatus, the standard recognition marks are used for aligning the wafer properly and inspecting the alignment. Then, a saw blade of the sawing apparatus saws the wafer along the scribe lines on which the standard recognition marks are formed.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED

Embodiments of the present invention will be described below with reference to the accompanying drawings.

Figure 1:
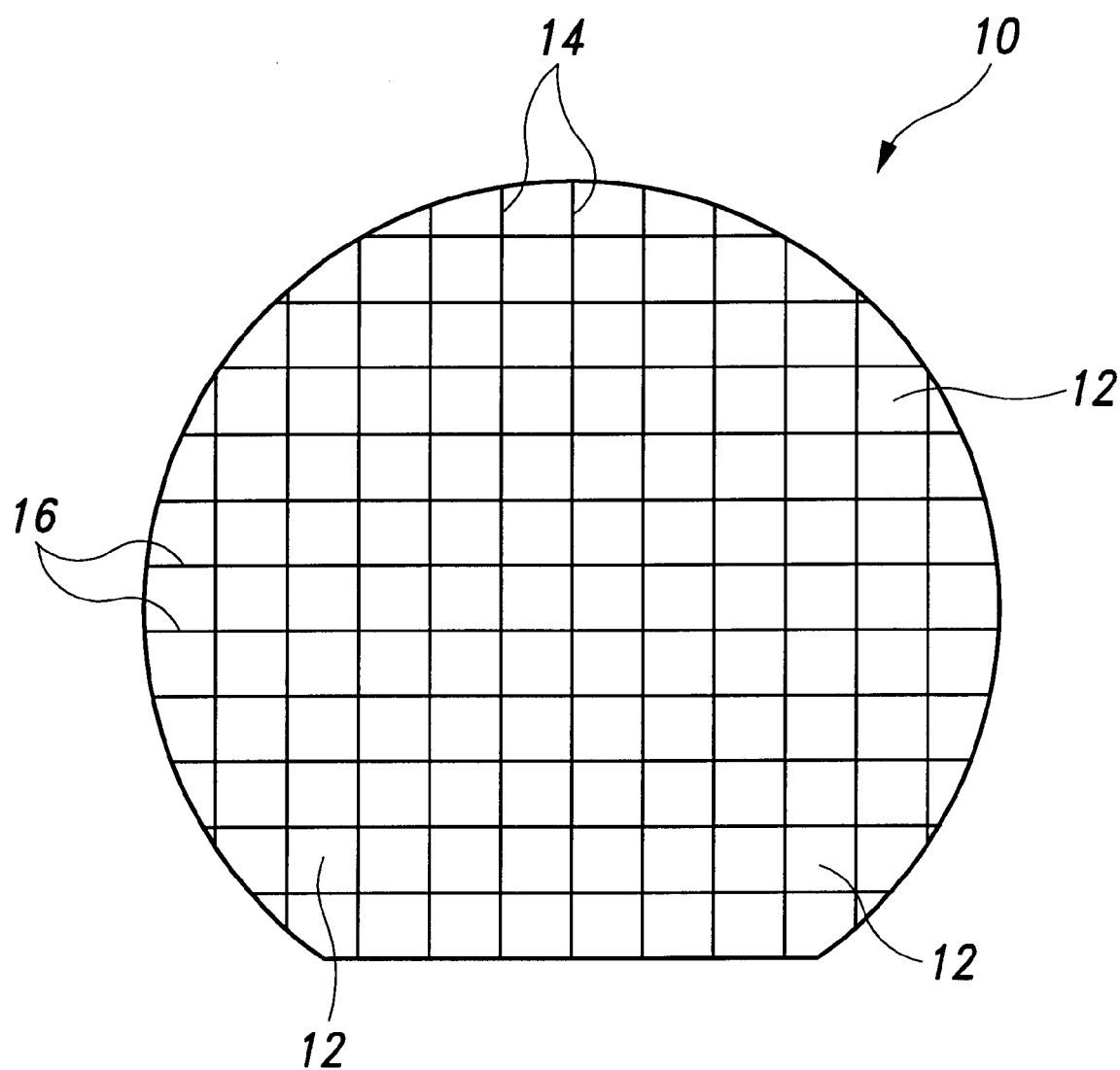
FIG. 1 is a plan view of a semiconductor wafer.
Figure 2:
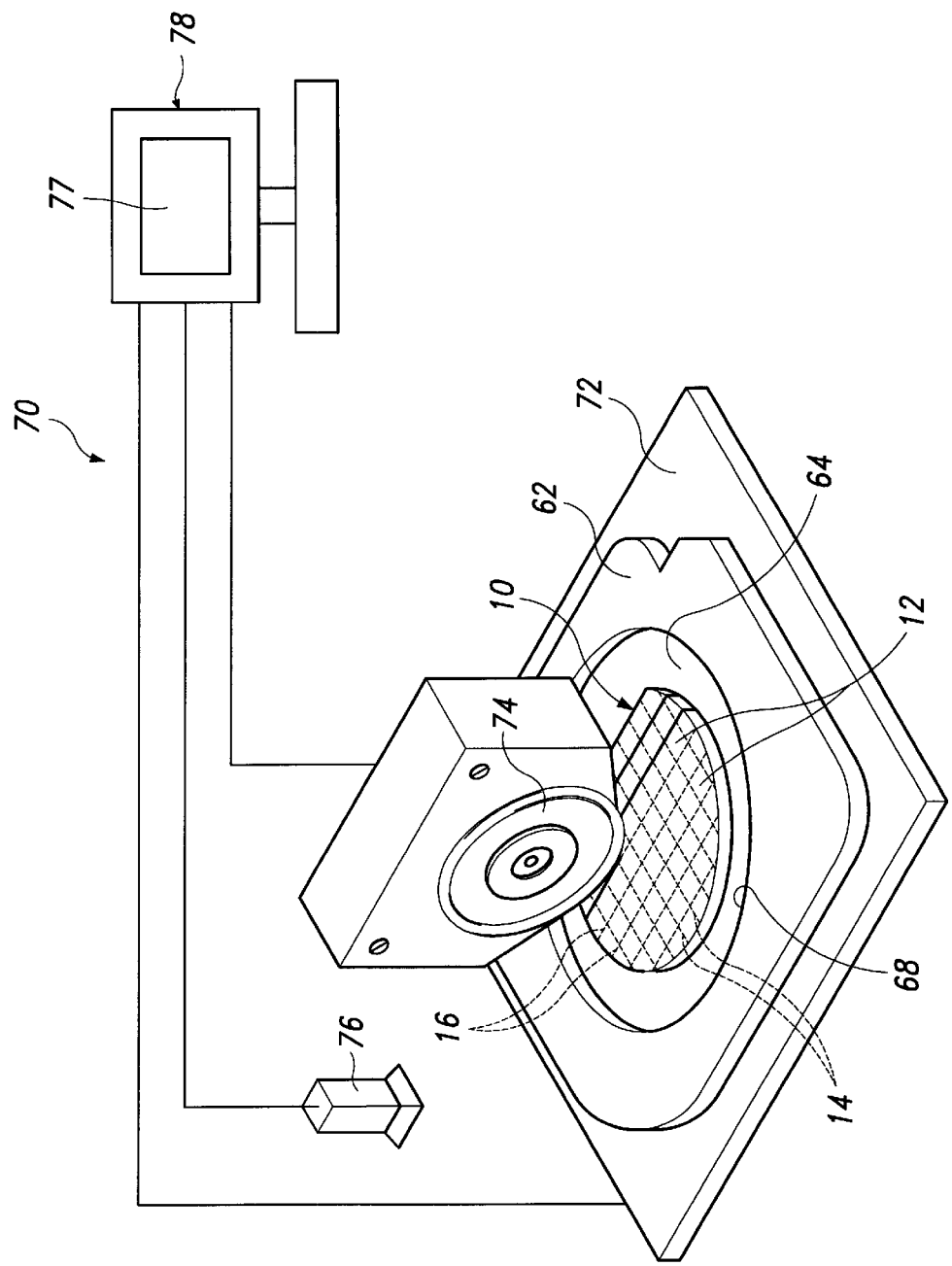
FIG. 2 is a diagram depicting a wafer sawing apparatus for sawing the semiconductor wafer in FIG. 1.
Figure 3:
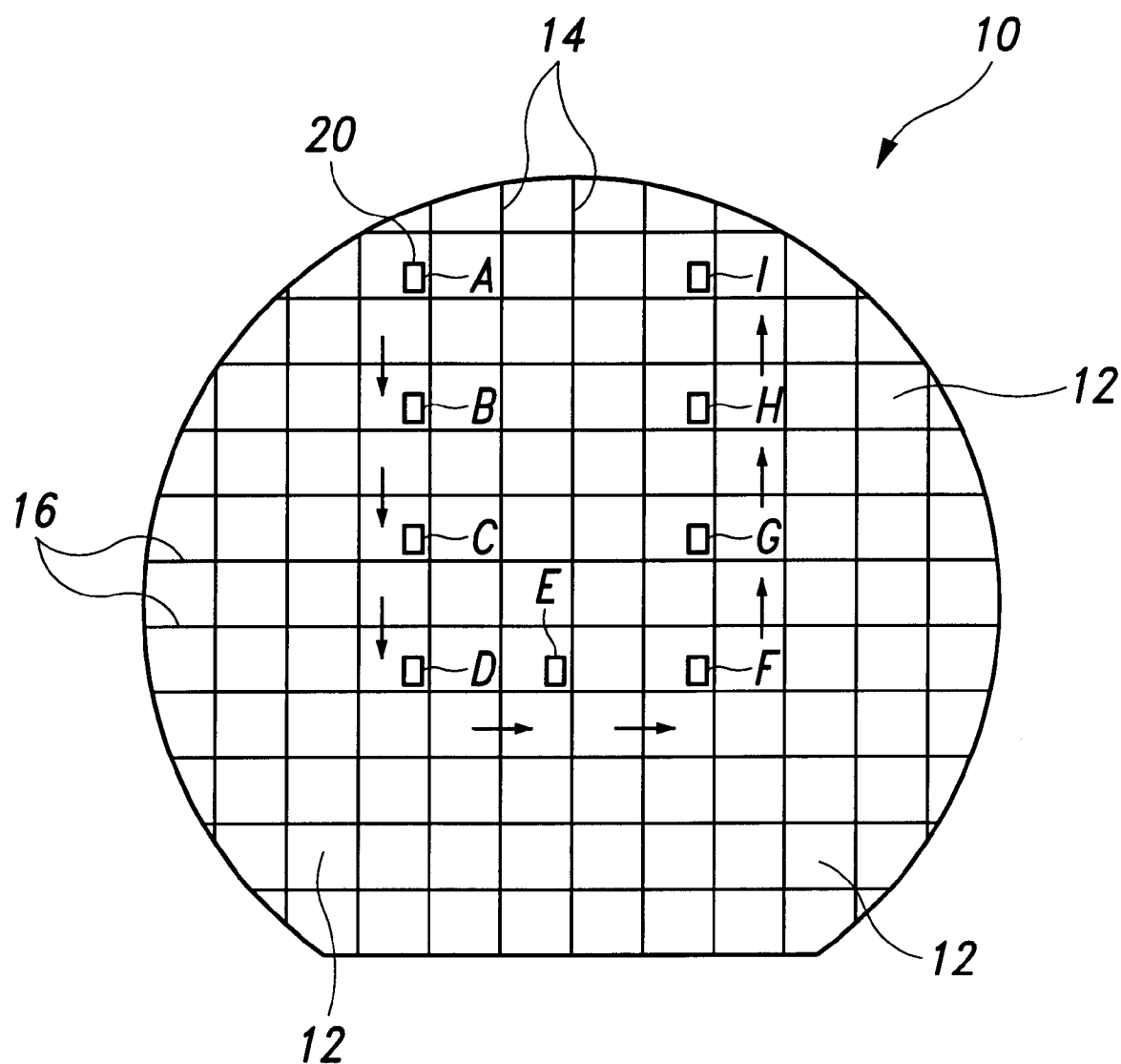
FIG. 3 is a plan view showing a method for recognizing patterns on the semiconductor wafer by the wafer sawing apparatus in FIG. 2.
Figure 4:
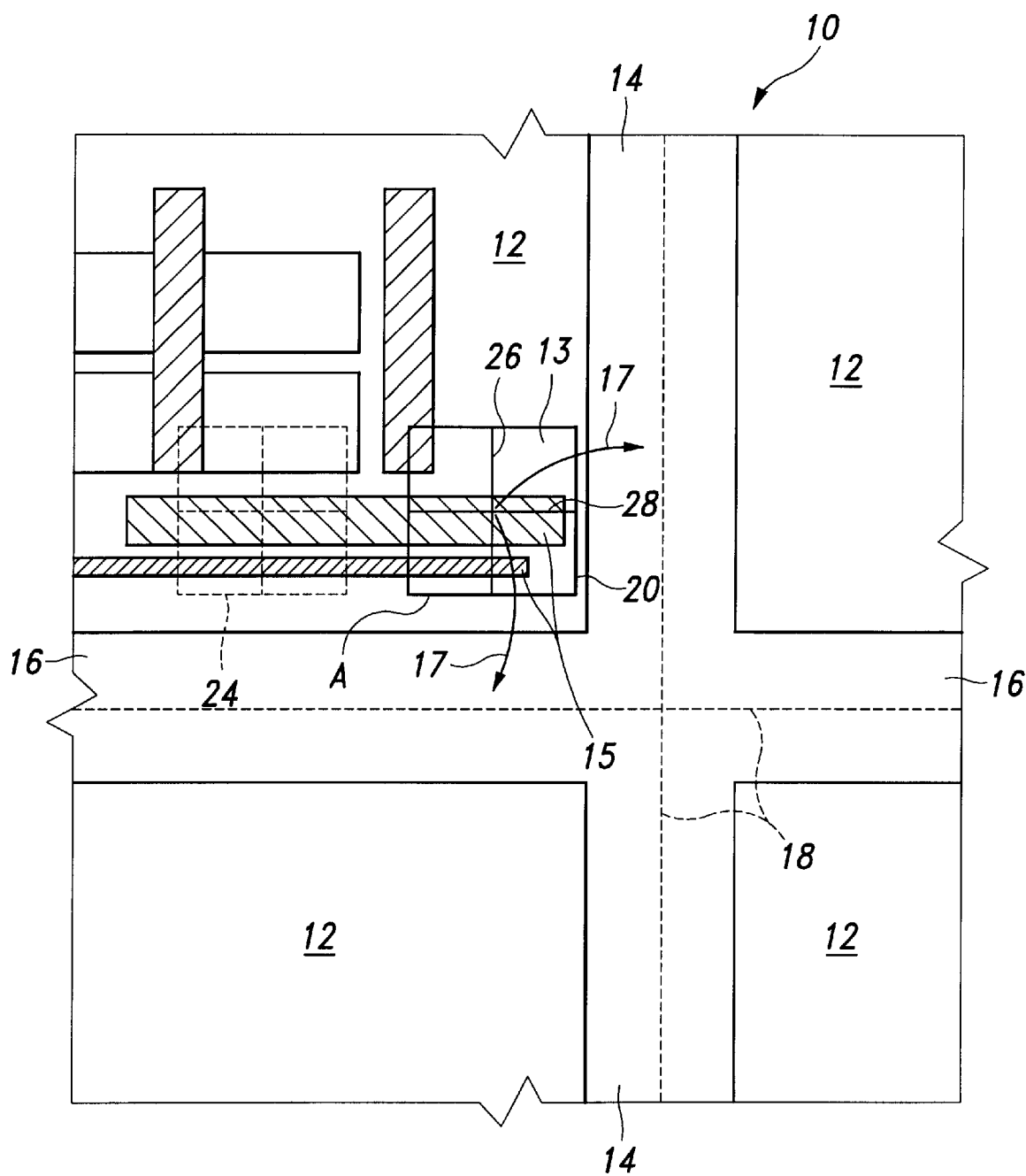
FIG. 4 is an enlarged view of a portion of FIG. 3.
Figure 5:
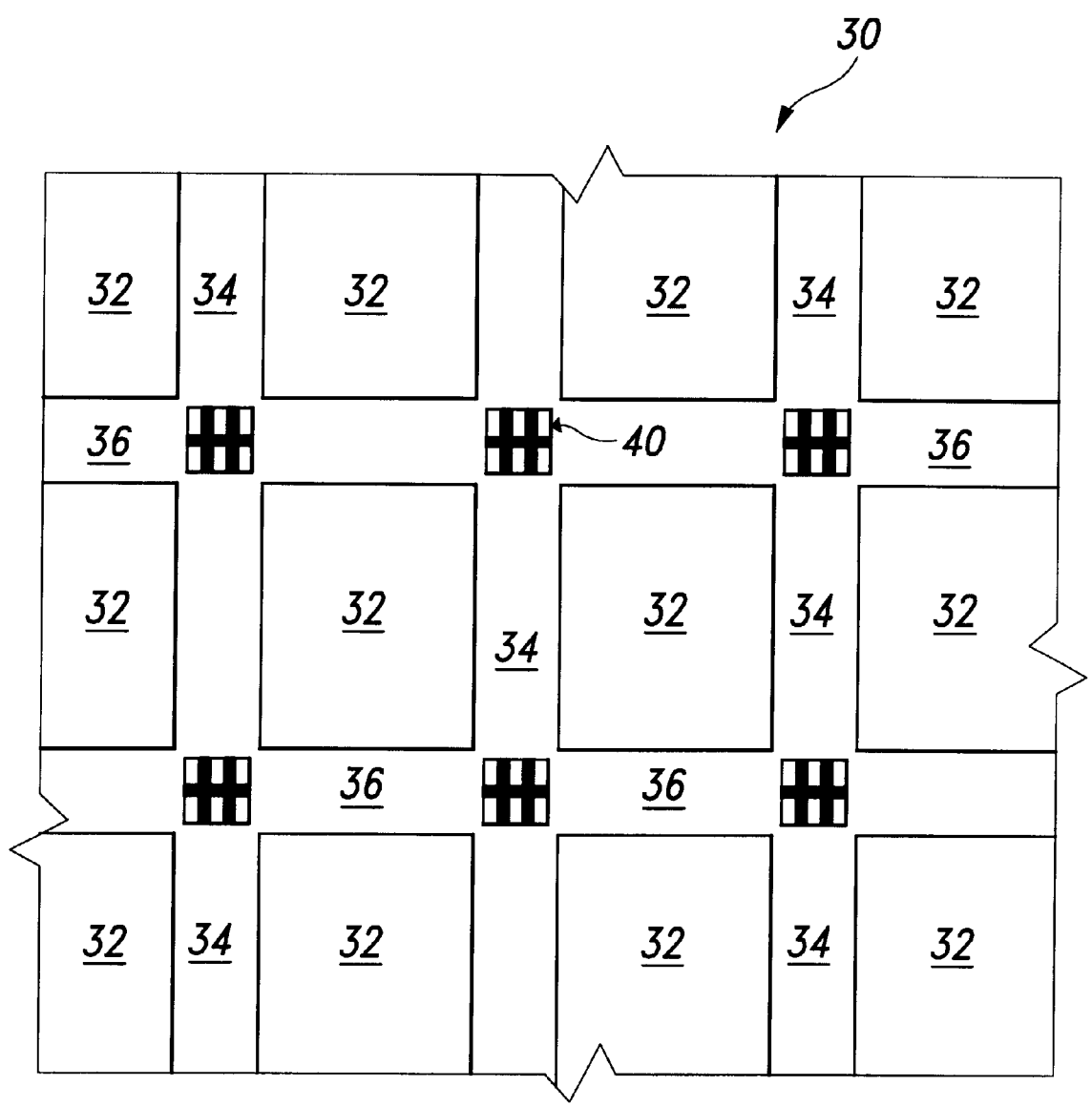
FIG. 5 is a plan view of a semiconductor wafer according to the present invention.
Figure 6:
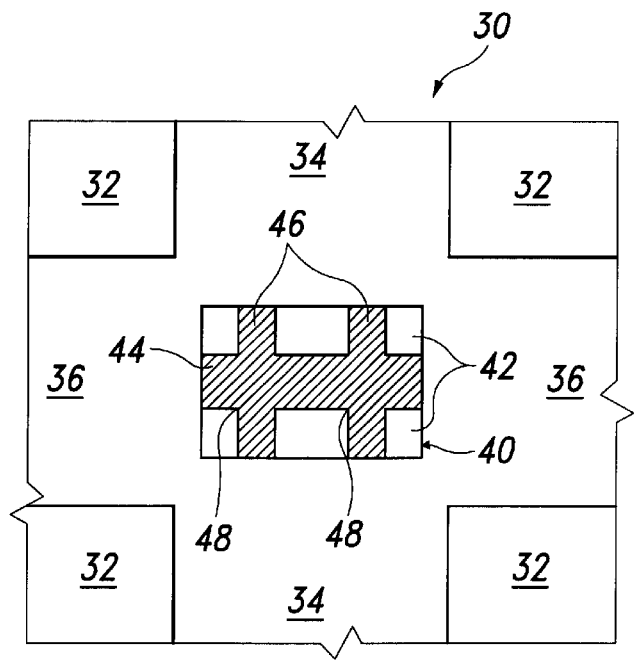
FIG. 6 is an enlarged plan view of FIG. 5, showing an area on which a recognition mark is formed.

With reference to FIG. 5 and FIG. 6, a semiconductor wafer 30 comprises a plurality of semiconductor chips 32 having integrated circuits formed thereon and a plurality of vertical and horizontal scribe lines 34 and 36 that separate semiconductor chips 32 from each other. The vertical and the horizontal scribe lines 34 and 36 have no circuitry, and a wafer sawing process cuts the wafer 30 along scribe lines 34 and 36 to produce individual semiconductor chips 32. The width of vertical and horizontal scribe lines 34 and 36 are typically 5 to 7 mils.

A recognition mark 40 is formed on each crossing point where a vertical scribe line 34 intersects a horizontal scribe line 36. This recognition mark 40 is used as a reference pattern for inspecting wafer alignment.

Figure 8:
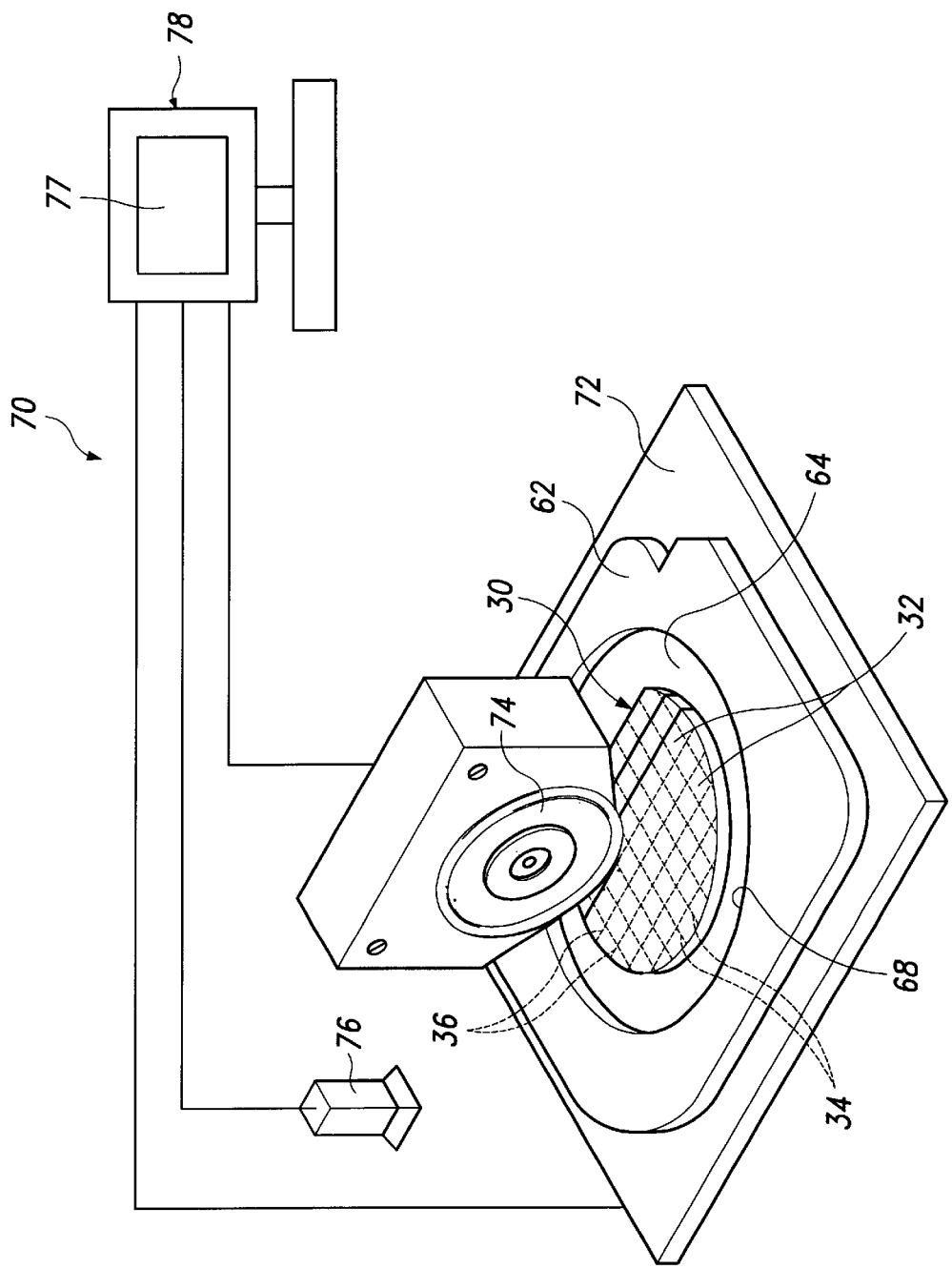
FIG. 8 is a diagram depicting a wafer sawing apparatus for sawing the wafer in FIG. 5.

Recognition marks 40 can have a plurality of patterns that can be easily recognized by a camera 76 (FIG. 8).

FIG. 6 shows an embodiment of a recognition mark of the present invention. Recognition mark 40 comprises dark pattern lines 44 and 46 and remaining bright region 42. Dark pattern lines 44 and 46 have crossing points 48 where dark lines 44 and 46 intersect each other. The dark pattern lines include one horizontal line 44 and two vertical lines 46, but any number of lines can be employed. Preferably, the ratio of dark area to bright area within recognition mark 40 is about 1:1.

Figure 7:
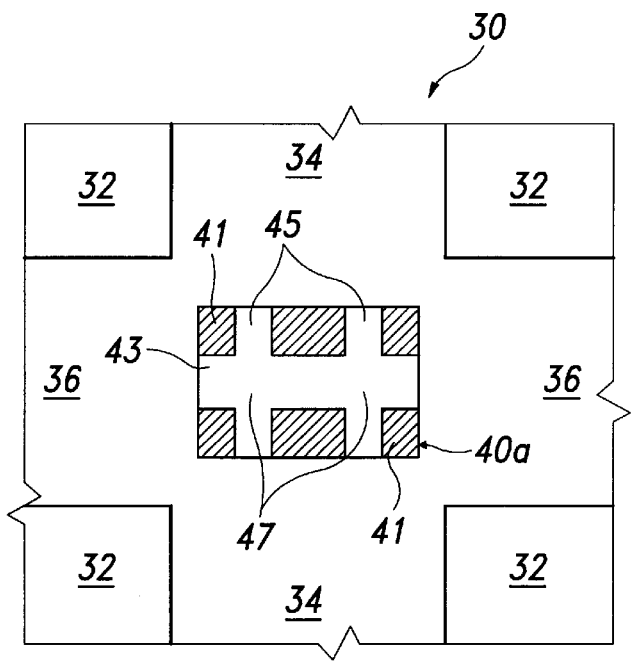
FIG. 7 is an enlarged plan view showing an area on which a recognition mark is formed according to another embodiment of the present invention.

FIG. 7 shows an embodiment of a recognition mark 40a including bright pattern lines 43 and 45 and a remaining dark region 41. Bright pattern lines 43 and 45 have crossing points 47 where bright lines 44 and 46 intersect each other. The bright pattern lines include one horizontal line 43 and two vertical lines 46. Again, the ratio of dark area to bright area within recognition mark 40a is preferably about 1:1.

FIG. 8 shows a wafer sawing apparatus 70 that includes a wafer aligning stage 72, a saw blade 74 for sawing the wafer 30, and a control unit 78. Control unit 78 has a monitor 77 and a recognition means such as a camera 76 for recognizing recognition marks 40 (FIG. 10) on wafer 30. Control unit 78 controls wafer aligning part 72, saw blade 74, and camera 76. Monitor 77 displays the state of sawing process.

A wafer ring 62 is used for easy handling of wafer 30. The opening of wafer ring 62 is greater than wafer 30. Prior to the sawing process, the lower surface of wafer 30 and wafer ring 62 are attached together with an adhesive tape 64. Wafer ring 62 holds wafer 30 not only during wafer sawing, but also during chip attachment in which semiconductor chips 32 are detached from tape 64 and attached to die pads of lead frames or chip mounting pads of printed circuit boards. Herein, FIG. 8 shows the wafer sawing along horizontal scribe line 36.

Figure 9:
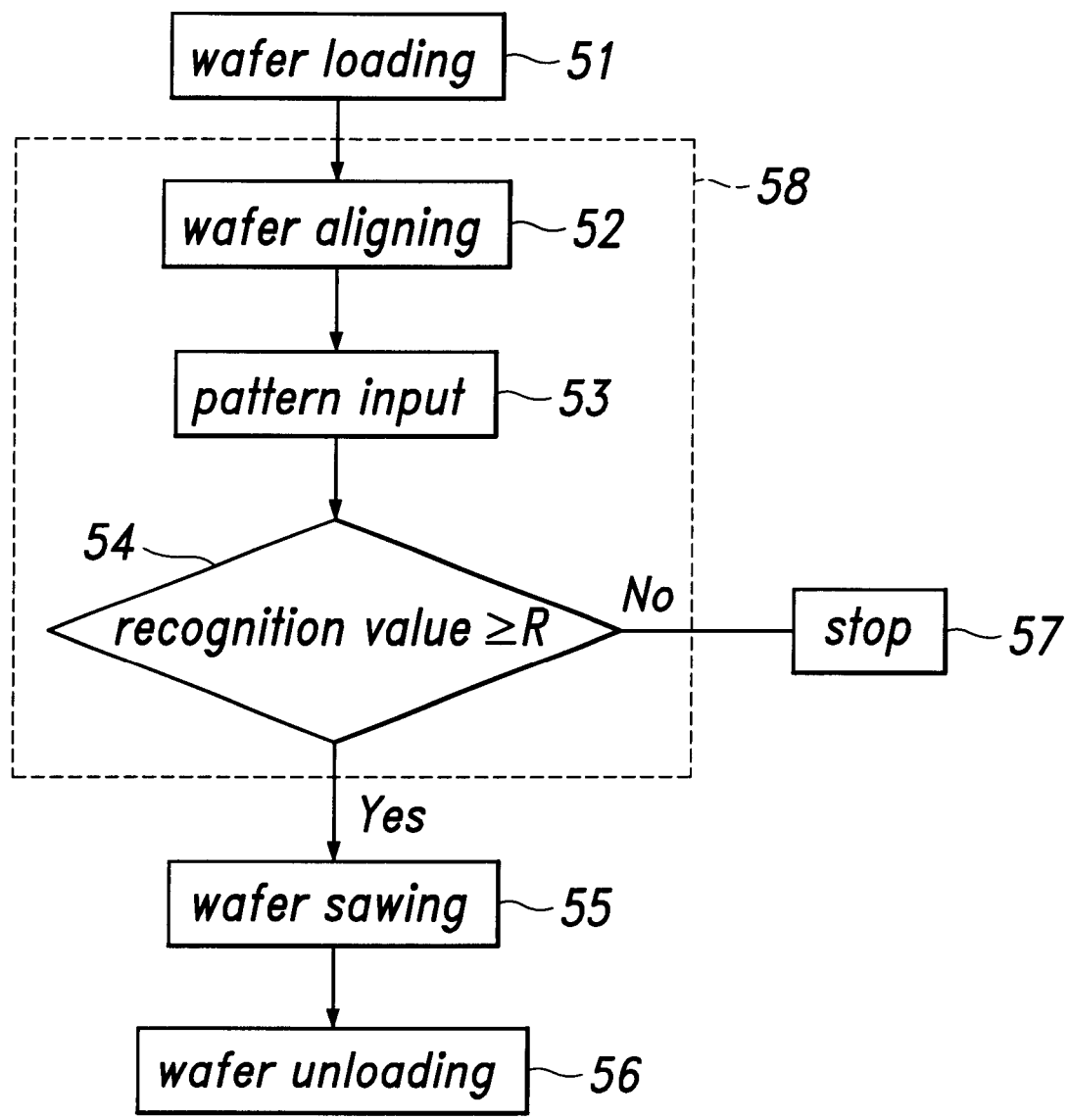
FIG. 9 is a flow chart showing a wafer sawing process using the wafer sawing apparatus in FIG. 8; and, FIG. 10 is a plan view showing a method for recognizing recognition marks by the wafer sawing apparatus in FIG. 8.
Figure 10:
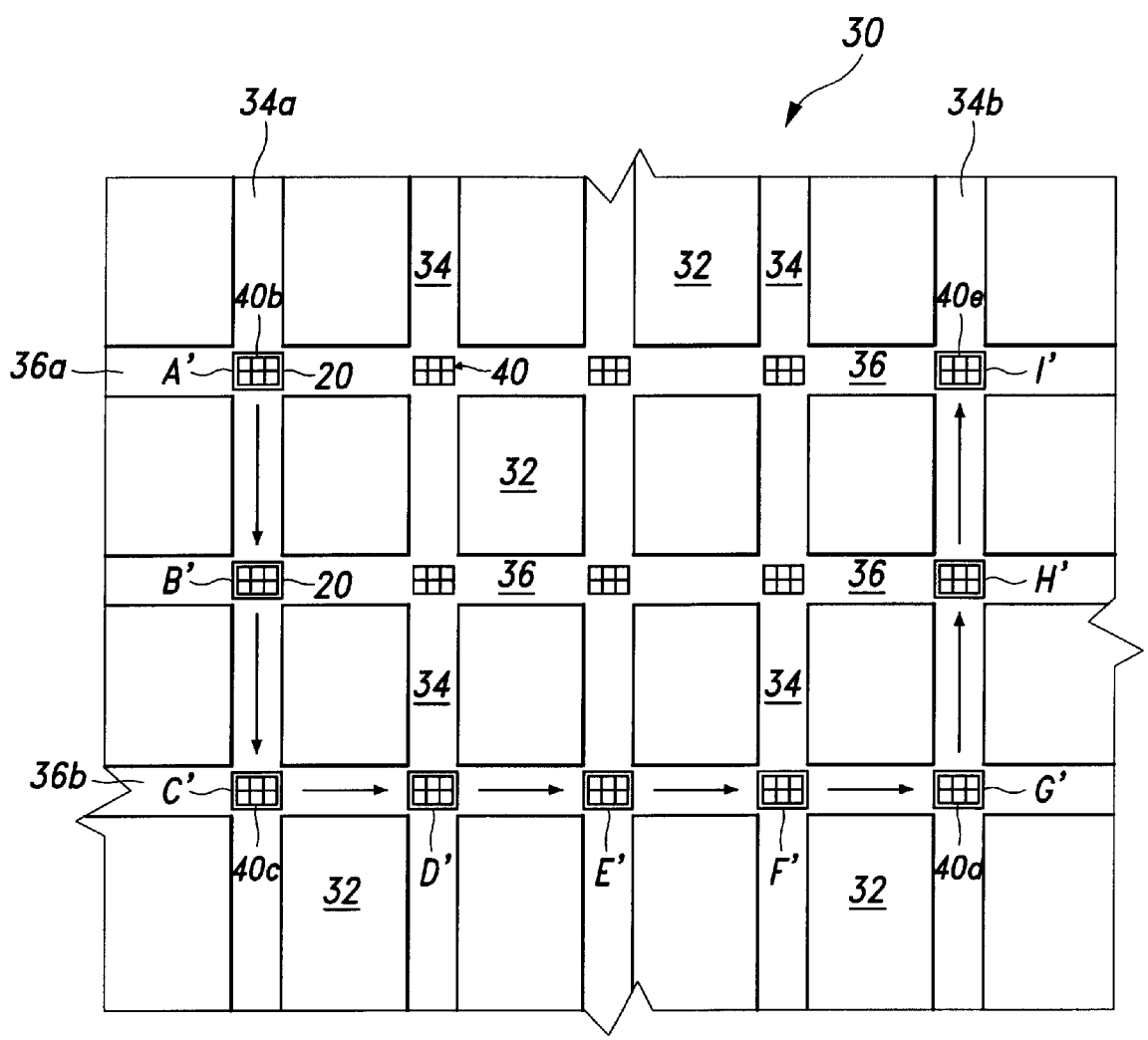

With reference to FIG. 8 to FIG. 10, a wafer sawing process according to the present invention will be described hereinafter. FIG. 9 shows steps used in the operation of wafer sawing apparatus 70. In step 51, wafer ring 62 holding wafer 30 is loaded on wafer aligning stage 72 from a wafer cassette (not shown) which contains wafer rings 62 with wafers 30. The camera 76 recognizes recognition mark 40 on wafer 30. Then, in step 58, control unit 78 drives wafer aligning stage 72 and, according to the data obtained from recognition mark 40, aligns one of vertical or horizontal scribe lines 34 or 36 under saw blade 74. After finishing wafer alignment (step 58 ), saw blade 74 cuts wafer 30 (step 55 ), and at step 56 unloads the completely sawn wafer from wafer aligning stage 72 and loads the sawn wafer to the wafer cassette.

Wafer aligning step will be described in more detail. First, in step 52, camera 76 recognizes two recognition marks 40 on wafer 30 and thereby, one of vertical and horizontal scribe lines 34 and 36 are aligned under saw blade 74. Recognition marks 40 can be used for the two spots for alignment, and scribe lines 34 and 36 are aligned under saw blade 74 by moving wafer aligning stage 72. In prior art that camera 76 recognizes a part of the semiconductor chip on the wafer for aligning, control unit 78 makes an additional movement of wafer to align scribe lines and of the wafer under saw blade 74. On the other hand, in the present invention, since camera 76 recognizes recognition marks 40 formed on the crossing points where vertical and horizontal scribe lines 34 and 36 intersect each other, it is possible to align vertical and horizontal scribe lines 34 and 36 under saw blade 74 without correcting the position of wafer 30.

Next, steps 53 and 54 determine whether wafer 30 is aligned to the required tolerances. In a pattern input step 53, camera 76 images recognition mark 40b on wafer 30. This recognition mark 40b is designated and recognized as a reference pattern. Camera 76 also images other recognition marks 40 of wafer 30, and the image data from recognition marks are transmitted to control unit 78. As shown in FIG. 10, for example, camera 76 images nine spots A' to I', and the image data for the nine spots A' to I' are transmitted to control unit 78. When the standard pattern A' is set to have a recognition value of 100, recognition values of the nine spots A' to I' are measured, and control unit 78 compares respective recognition values with a judgment value R. (step 54 ) If all recognition values of the spots A' to I' are greater than the judgment value R, control unit 78 decides that wafer 30 is properly aligned, and starts sawing wafer 30 with saw blade 74. However, if any of the recognition values of the spots A' to I' is less than the judgment value R, control unit 78 decides that wafer 30 is not properly aligned, and in step 57, withholds sawing. Herein, the judgment value R is 90.

Described in more detail, a reference numeral 20 in FIG. 10 indicates a window, through which camera 76 images recognition marks 40. Based on reference pattern 40 b, camera 76 recognizes nine spots A' to I' by successively recognizing three spots A', B', and C' along vertical scribe line 34 a on which reference pattern 40b is formed, four spots D', E', F', and G' along horizontal scribe line 36b on which spot C' is formed, and two spots H' and I' along vertical line 34b on which spot G' is formed. First spot A' and ninth spot I' are on the same horizontal scribe line 36a.

As shown in FIG. 10, camera 76 recognizes neighboring recognition marks 40 on the same scribe lines 34a, 34b, 36a, and 36b. However, if the wafer sawing apparatus is set so that spot A' and spot I' are on the same horizontal scribe line 36a, spot C' and spot G' are on the same horizontal line 36b, spot A' and spot C' are on the same vertical scribe line 34a, and spot G' and spot I' are on the same vertical scribe line 34b, it may be unnecessary to recognize some neighboring recognition marks 40 on the same scribe lines 34a, 34b, 36a, and 36b, such as spots B', D', E', F', and H'. For example, a second spot to be recognized from the standard patterns 40b may be spot C' in FIG. 10.

If the horizontal scribe lines are aligned first as described above, the sawing apparatus saves alignment information indicating the position of the wafer, and the vertical scribe lines are aligned by rotating the alignment stage by 90 degrees and performing the same method as described above. After finishing the alignment of the both scribe lines, the sawing blade saws the wafer along the horizontal scribe lines, rotates the alignment stage by 90 degrees and saws the vertical scribe lines.

Since recognition marks 40 are formed on the intersections of vertical scribe lines 34 and horizontal scribe lines 36, and wafer 30 is aligned by recognizing the recognition marks 40 of the nine spots A' to I', based on the predetermined standard pattern 40b, the sawing step of the wafer 30 is carried out without correcting the position of the wafer 30 after recognizing the standard pattern 40b. In particular, saw blade 74 is directly aligned with lines through recognition marks 40, and a further offset is not required.

Table 2 shows a result of PMS operation according to the present invention. The result describes recognition values of recognition marks 40 of the nine spots A' to I' of wafer 30, the judgment based on the judgment value (90) and the decision of the operation of subsequent wafer sawing step. The recognition values are calculated by a wafer sawing apparatus such as DFD-640 from DISCO company in the U.S. The highest recognition value is 100, and the lower the recognition value is, the larger the difference between a standard recognition mark and a current recognition mark is.

TABLE 2

| Spot | A' | B' | C' | D' | E' | F' | G' | H' | I' |
| --- | --- | --- | --- | --- | --- | --- | --- | --- | --- |
| Recognition value | 99 | 98 | 94 | 97 | 98 | 93 | 97 | 95 | 97 |
| Judgment | OK | OK | OK | OK | OK | OK | OK | OK | OK |
| Operation | | | | the wafer sawing | | | | | |

In table 2, spot A' provides the reference pattern. The recognition value of spot A' is not 100 but 99, and the recognition values of the other spots B' to I' are also not 100. This departure from 100 is caused by a mechanical positioning error of camera 76 during operation. However, the present invention produces higher recognition values than the case of a prior art where a part the circuit patterns of semiconductor chip 10 is used for recognition and alignment. Formation of standard recognition marks 40 on vertical and horizontal scribe lines 34 and 36 increased the recognition values of recognized spots by facilitating camera 76 to recognize recognition marks 40.

Moreover, the present invention uses a high judgment value. When a part of the circuit patterns of semiconductor chip 10 is used for recognition and alignment, a relatively low judgment value is used because the allowable mechanical error of camera can include various parts of circuit patterns within the window of camera. This low judgment can result in an alignment error by allowing a similar, but different, patterns to be accepted by the control unit of sawing apparatus. However, owing to the distinct standard pattern for wafer alignment, the present invention can use high judgment value and therefore, avoid alignment errors.

According to the present invention, since the recognition marks are formed on the intersections of the horizontal scribe lines and the vertical scribe lines having no circuitry, and therefore independent of the pattern structure of the semiconductor chip which is formed on the wafer, although the semiconductor chip has small size, it is easy to designate the standard pattern.

Although embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method of sawing semiconductor wafers, comprising:
   (A) preparing a semiconductor wafer comprising a plurality of semiconductor chips, a plurality of scribe lines including horizontal scribe lines and vertical scribe lines, and a plurality of recognition marks formed on crossing points where horizontal and vertical scribe lines intersect;
   (B) loading the semiconductor wafer on a wafer sawing apparatus having a saw blade;
   (C) aligning the scribe lines of the semiconductor wafer under the saw blade by recognizing the recognition marks;
   (D) sawing the semiconductor wafer along the scribe lines to cut the wafer into individual semiconductor chips;
   (E) recognizing one of the recognition marks as a reference mark;
   (F) determining whether the scribe lines of the wafer are aligned by determining positions for a plurality of recognition marks relative to the reference mark, wherein step (F) comprises:
      (F1) successively recognizing recognition marks at first, second, and third spots along a vertical scribe line on which the reference recognition mark is formed;
      (F2) successively recognizing recognition marks at fourth, fifth, sixth, and seventh spots along a horizontal scribe line on which the third spot is formed; and
      (F3) successively recognizing recognition marks at eighth and ninth spots along a vertical scribe line on which the seventh spot is formed,
         wherein the ninth spot of step (F3) is on the same horizontal scribe line as the reference recognition mark.

2. The method of claim 1, wherein in step (D), if the scribe line of the wafer is not exactly aligned with a saw blade, the saw blade does not saw the semiconductor wafer.

3. The method of claim 1, wherein in step (F), whether the scribe line of the wafer is exactly aligned is inspected by recognizing the recognition marks at nine spots on the wafer including a spot containing the reference mark.

4. The method of claim 1, wherein each recognition mark comprises a bright region and a dark region.

5. The method of claim 4, wherein the bright region comprises a plurality of bright lines, and the dark region surrounds the bright lines.

6. The method of claim 5, wherein the bright lines are separated from each other.

7. The method of claim 5, wherein the bright lines intersect each other.

8. The method of claim 4, wherein the dark region comprises a plurality of dark lines, and the bright region surrounds the dark lines.

9. The method of claim 8, wherein the dark lines are separated from each other.

10. The method of claim 8, wherein the dark lines intersect each other.

11. The method of claim 4, wherein the bright region and the dark region have areas that are equal.

* * * * *